United States Patent
Hölscher et al.

(10) Patent No.: US 10,830,852 B2
(45) Date of Patent: Nov. 10, 2020

(54) DEVICE AND METHOD FOR GENERATING EXCITATION PULSES

(71) Applicant: Siemens Healthcare GmbH, Erlangen (DE)

(72) Inventors: Uvo Hölscher, Erlangen (DE); Stephan Stöcker, Baiersdorf (DE); Christian Wünsch, Röthenbach a.d.Pegnitz (DE)

(73) Assignee: Siemens Healthcare GmbH, Erlangen (DE)

( * ) Notice: Subject to any disclaimer, the term of this patent is extended or adjusted under 35 U.S.C. 154(b) by 55 days.

(21) Appl. No.: 16/204,465

(22) Filed: Nov. 29, 2018

(65) Prior Publication Data

US 2019/0162804 A1    May 30, 2019

(30) Foreign Application Priority Data

Nov. 30, 2017    (DE) .......................... 10 2017 221 608

(51) Int. Cl.
  *G01R 33/54*    (2006.01)
  *G01R 33/36*    (2006.01)
  (Continued)

(52) U.S. Cl.
  CPC .......... *G01R 33/543* (2013.01); *G01R 33/288* (2013.01); *G01R 33/3607* (2013.01);
  (Continued)

(58) Field of Classification Search
  CPC .............. G01R 33/288; G01R 33/3607; G01R 33/3614; G01R 33/4835; G01R 33/543; G01R 33/5659
  See application file for complete search history.

(56) References Cited

U.S. PATENT DOCUMENTS 4,973,906 A    11/1990 Bernstein
5,140,268 A *   8/1992 Chan .................. G01R 33/3607
                                                        324/307
(Continued)

FOREIGN PATENT DOCUMENTS

CN    101229062 A    7/2008
CN    103083020 A    5/2013
(Continued)

OTHER PUBLICATIONS

German Research Report for German Application No. 102017221608.5, dated May 18, 2018.
(Continued)

*Primary Examiner* — Rishi R Patel
(74) *Attorney, Agent, or Firm* — Lempia Summerfield Katz LLC

(57) ABSTRACT

A radio-frequency control system for a magnetic resonance tomography system and a method for the operation thereof are provided. The radio-frequency control system includes a controller and a radio-frequency power amplifier with amplification between a signal input and a signal output of the radio-frequency power amplifier that is dependent on a predetermined frequency response. The controller determines a control pulse for multislice excitation and outputs the pulse to the signal input of the radio-frequency power amplifier. The controller determines a high-frequency power value for the control pulse in dependence on the predetermined frequency response of the radio-frequency power amplifier.

17 Claims, 2 Drawing Sheets

(51) Int. Cl.
*G01R 33/483* (2006.01)
*G01R 33/28* (2006.01)
*G01R 33/565* (2006.01)

(52) U.S. Cl.
CPC ...... *G01R 33/3614* (2013.01); *G01R 33/4835* (2013.01); *G01R 33/5659* (2013.01)

(56) References Cited

U.S. PATENT DOCUMENTS

| | | | |
|---|---|---|---|
| 6,097,185 A * | 8/2000 | Watanabe | G01R 33/4835 324/307 |
| 2005/0197077 A1 | 9/2005 | Bielmeier | |
| 2006/0197528 A1 | 9/2006 | Bielmeier | |
| 2008/0180098 A1 | 7/2008 | Takei | |
| 2013/0113483 A1 | 5/2013 | Park | |
| 2013/0162250 A1 | 6/2013 | Sabate | |
| 2013/0229180 A1 | 9/2013 | Demharter | |
| 2013/0257430 A1 | 10/2013 | Ritter | |

FOREIGN PATENT DOCUMENTS

| | | |
|---|---|---|
| CN | 103176150 A | 6/2013 |
| CN | 103364749 A | 10/2013 |
| CN | 204652314 U | 9/2015 |
| DE | 102004006552 A1 | 9/2005 |
| DE | 102005007895 A1 | 8/2006 |
| DE | 102012203452 A1 | 9/2013 |
| JP | H03118043 A | 5/1991 |

OTHER PUBLICATIONS

Chinese Office Action for Chinese Application No. 201811441130.3 dated Sep. 9, 2020.

* cited by examiner

DEVICE AND METHOD FOR GENERATING EXCITATION PULSES

This application claims the benefit of DE 10 2017 221 608.5, filed on Nov. 30, 2017, which is hereby incorporated by reference in its entirety

BACKGROUND

The present embodiments relate to radio-frequency control system for a magnetic resonance tomography system and a method for operating the magnetic resonance tomography system.

Magnetic resonance tomography systems are imaging devices that, in order to map an object under examination, align nuclear spins of the object under examination with a strong external magnetic field and excite the nuclear spins by an alternating magnetic field to precess about the alignment. The precession or return of the spins from this excited state to a state with a lower energy generates an alternating magnetic field as a response (e.g., a magnetic resonance signal) that is received via antennas.

With the aid of magnetic gradient fields, position encoding that subsequently enables an association of the received signal with a volume element is imparted to the signals. The received signal is then evaluated, and a three-dimensional imaging display of the object under examination is provided. The display generated indicates the spatial spin density distribution.

To accelerate image acquisition, some magnetic resonance tomography systems simultaneously read magnetic resonance signals from a plurality of slices that are usually arranged parallel next to one another in the z-direction along the static B0 field. Due to the magnetic field gradients that are applied in the z-axis for the encoding, excitation of nuclear spins in these slices requires alternating magnetic fields with a different Larmor frequency in the z-direction. Herein, the frequency spacing for individual slices and hence the bandwidth of the multislice excitation pulse is approximately proportional to the spacing of the slicing and is equal to a multiple of the bandwidth of an excitation pulse for an individual slice. While the radio-frequency output stages or radio-frequency power amplifiers used in magnetic resonance tomography systems for a bandwidth corresponding to a single slice are almost linear, with a multiple bandwidth, it is often only possible at a justifiable expense to achieve a frequency response with a marked drop of, for example, 3 dB or 6 dB or more toward the edges.

To protect the patient from excessive exposure to heat from the radio-frequency radiation, the power of the excitation pulses is to be restricted to regulatory limit radio-frequency values. This may, for example, be achieved by measuring the power at the output of the radio-frequency power amplifier. Herein, to provide the safety of the patient in the event of an outage of the power sensor, redundant independent device for determining the power are provided (e.g., using the control pulse supplied to the signal input of the radio-frequency power amplifier). Due to the subsequent frequency-dependent amplification in the radio-frequency power amplifier and the drop in power at the edges of the frequency band, however, it is assumed that the patient is being exposed to radiation with excessive power and the control pulse is limited to an unnecessarily low power. The result is a reduced signal-to-noise ratio.

Regardless of the limitation of the power for the patient's safety, inhomogeneous excitation in the different slices also results in image regions with low amplitudes that, for example, causes darker image regions with low contrast.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a device and a method for the generation of excitation pulses that provide improved imaging and a high degree of patient safety are provided.

The radio-frequency control system according to an embodiment includes a controller and a radio-frequency power amplifier. The radio-frequency power amplifier has amplification with a predetermined frequency response between a signal input and a signal output. Herein, typically, the frequency response is not constant, but deviates, at least at some frequencies, by 1 dB, 3 dB, 6 dB, 12 dB, or more from a constant frequency response. The controller is configured to determine a control pulse for multislice excitation. For example, a control pulse may be determined from the gradient field strength in the z-direction, desired slice thicknesses, and slice spacing. In the simplest case, a stored reference pulse may be shifted and multiplied in frequency space, and then, the individual pulses may be superimposed to form a control pulse.

The controller is configured to output the control pulse to the signal input of the radio-frequency power amplifier, for example, in that the digitally determined control pulse is converted by a DA converter into an analog signal for the radio-frequency power amplifier. Herein, the controller of the radio-frequency control system is configured to determine a high-frequency power value for the control pulse in dependence on the predetermined frequency response of the radio-frequency power amplifier. For the purpose of the present embodiments, 'determine for the control pulse' is not considered to be a measurement at the signal output of the radio-frequency power amplifier. In one embodiment, for the determination, the controller calculates a limit radio-frequency value from the control pulse or a frequency-response-independent nominal control pulse, for example, in that a squared amplitude of the control pulse is integrated over the duration. The calculation may be performed using analog or digital.

Herein, the determination is performed in dependence on the predetermined frequency response, which was, for example, determined in advance by calculations during construction or by measurements during operation. Herein, 'in dependence on' provides that the frequency response is included as a parameter in the determination (e.g., as a multiplier or summand), so that, at least for some frequencies, the result is changed compared to a constant frequency response.

Taking account of the predetermined frequency response or the frequency-dependent amplification of the radio-frequency power amplifier enables a more accurate estimation of the power output by the radio-frequency power amplifier. This enables the safety margin to the regulatory limit value to be reduced and the patient to be exposed to a higher effective radiated power, which due to the higher and more homogeneous excitation of the nuclear spins, results in a more homogeneous image with a higher signal-to-noise ratio.

The method according to one or more of the present embodiments for operating the radio-frequency control system shares the advantages of the radio-frequency control system.

In one embodiment of the radio-frequency control system, the radio-frequency control system is configured to weight the control pulse with the frequency response of the radio-frequency power amplifier for the determination of the high-frequency power value. For example, the controller may include a multiplying unit that multiplies or weights the power at every frequency with a damping value according to the predetermined frequency response. Herein, the controller may determine the spectral power at a frequency by a Fourier transform of the excitation pulse. However, a filter, which is, for example, determined by a Fourier transform from the frequency response, may be applied to the excitation pulse when calculating the power.

Spectral weighting based on the predetermined frequency response for the excitation pulse enables the high-frequency power output by the radio-frequency power amplifier as a result of the excitation pulse to be determined in a simple manner that is, for example, understandable for purposes of licensing.

In one embodiment of the radio-frequency control system, the radio-frequency control system is configured to weight a nominal control pulse for the generation of the control pulse with a function that is inverse to the frequency response. Herein, 'nominal control pulse' designates an ideal control pulse that, with linear amplification and linear frequency response through the radio-frequency power amplifier, results in the desired excitation pulse at the signal output of the radio-frequency power amplifier. The nominal control pulse is independent of the frequency response of the radio-frequency power amplifier. It is, for example, possible to apply a filter that is, for example, determined by a Fourier transform from the frequency response to the nominal control pulse so that, by successive application of filter and frequency response to the nominal control pulse, the nominal control pulse corresponds to the radio-frequency power spectrum. To make the high-frequency power value or the determination thereof independent of the generation of the control pulse for safety reasons, herein the control pulse may be weighted during the determination with the frequency response of the radio-frequency power amplifier. The high-frequency power value may, however, be determined directly from the nominal control pulse, which is linked to the control pulse via the inverse frequency response.

A nominal control pulse that is, for example, stored and may be determined directly for the one high-frequency power value may be used as a measure for the limitation of the radiated high-frequency power.

In one embodiment of the radio-frequency control system, the radio-frequency control system includes a power meter in signal connection with the signal output of the radio-frequency power amplifier. The radio-frequency control system or the controller of the radio-frequency control system in conjunction with the power meter is configured to determine the frequency response on a change of patient (e.g., when another patient is or has been positioned for an examination). The controller may, for example, be triggered by operator intervention or by the magnetic resonance tomography system-controller. For example, the controller may apply different measuring signals with different frequency components to the signal input of the radio-frequency power amplifier and determine the output power at the respective frequencies with the power meter. In one embodiment, the controller may output a test signal with a broad frequency spectrum to the signal input of the radio-frequency power amplifier as white noise, where the power meter is configured to digitize the output signal in real time and the controller determines the power distribution from this, for example, by a Fourier transform. In one embodiment, the frequency response may be checked for plausibility (e.g., whether the frequency response is within a predetermined value range) in order, for example, to identify an error in the power meter.

This enables account to be taken of changes to the frequency response (e.g., due to different complex loads from the patient's body).

In one embodiment of the radio-frequency control system, the radio-frequency control system is configured to compare the determined high-frequency power value with a predetermined limit radio-frequency value. The limit value may, for example, be derived from a regulatory specification for the maximum SAR power. If the limit radio-frequency value is exceeded by the high-frequency power value, the controller of the radio-frequency control system is configured to interrupt the outputting of the control pulse for multislice excitation to the signal input of the radio-frequency power amplifier. However, to increase safety, a separate monitoring circuit in the radio-frequency control system may also be provided. To suppress the control pulse, it is, for example, possible for output to the DA converter to be interrupted or the signal input of the radio-frequency power amplifier to be short-circuited or interrupted by a switch.

The patient is thus not exposed to excessive radio-frequency power.

The method according to one or more of the present embodiments for operating the radio-frequency control system shares the advantages of the radio-frequency control system.

DETAILED DESCRIPTION

Figure 1:
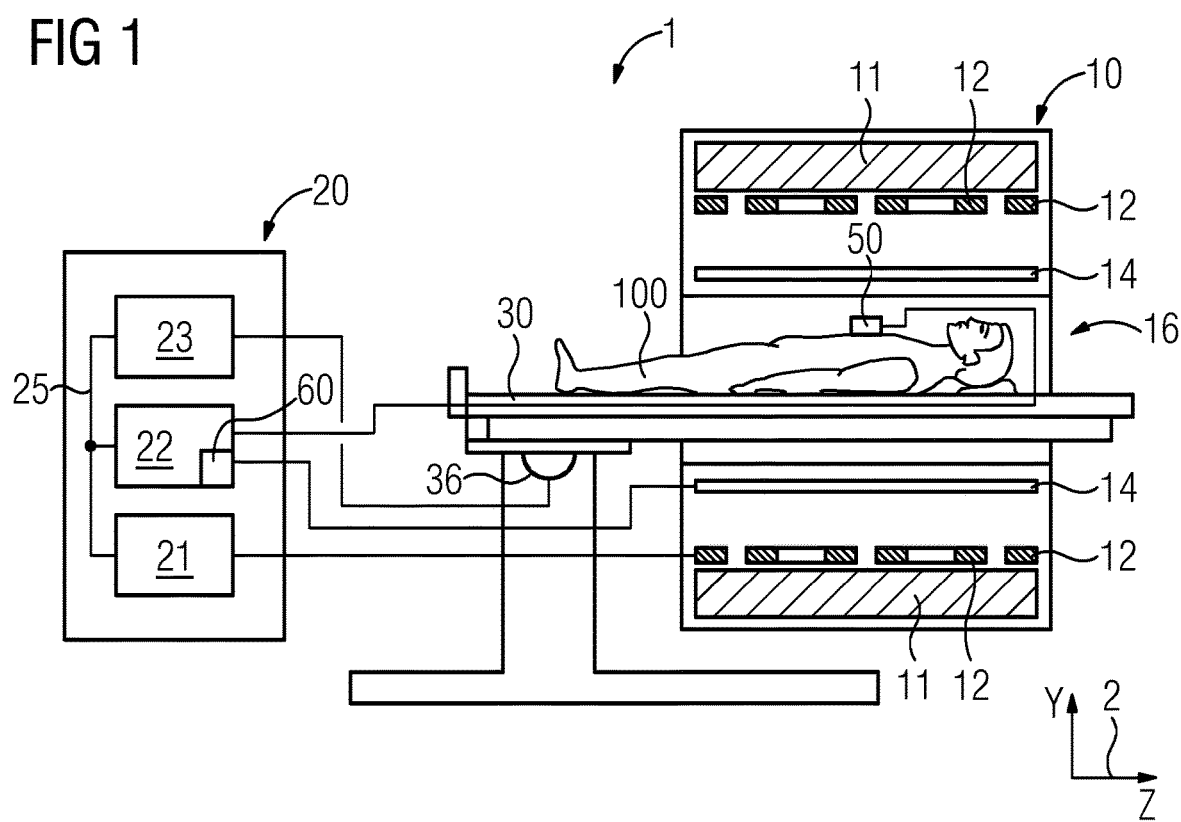
FIG. 1 shows an exemplary schematic depiction of a magnetic resonance tomography system with a radio-frequency control system according to an embodiment.

FIG. 1 shows a schematic depiction of an embodiment of a magnetic resonance tomography system 1 with a radio-frequency control system 60.

The magnet unit 10 includes a field magnet 11 that generates a static magnetic field B0 for alignment of nuclear spins in specimens or patients 100 in a recording region. The recording region is arranged in a patient tunnel 16 extending in a longitudinal direction 2 through the magnet unit 10. A patient 100 may be moved by the patient bench 30 and the moving unit 36 of the patient bench 30 into the recording region. The field magnet 11 may, for example, be a superconducting magnet that may provide magnetic fields with a magnetic flux density of up to 3 T, or even more with state-of-the art devices. It is, however, also possible to use permanent magnets or electromagnets having normal-conducting coils for lower field strengths.

The magnet unit 10 also includes gradient coils 12 that, for spatial differentiation of the acquired mapping regions in the examination volume, are configured to overlay the magnetic field B0 with variable magnetic fields in three spatial directions. The gradient coils 12 may be coils made of normally conducting wires that may generate fields in the examination volume that are orthogonal to one another.

The magnet unit 10 also includes a body coil 14 that is configured to irradiate a radio-frequency signal supplied via a signal line 33 into the examination volume, receive resonance signals emitted by the patient 100, and output the resonance signals via a signal line. In one embodiment, the body coil 14 for emitting the radio-frequency signal and/or reception is replaced by local coils 50 arranged in the patient tunnel 16 close to the patient 100. In one embodiment, the local coil 50 may be configured for transmission and reception so that a body coil 14 may be dispensed with.

A control unit 20 supplies the magnet unit 10 with the different signals for the gradient coils 12 and the body coil 14 and evaluates the received signals. A magnetic resonance tomography system-controller 23 coordinates the subunits.

Thus, the control unit 20 includes a gradient controller 21 that is configured to supply the gradient coils 12 with variable currents via supply lines that provide the desired gradient fields in the examination volume in a temporally coordinated manner.

The control unit 20 also includes a radio-frequency unit 22 that is configured to generate a radio-frequency pulse with a prespecified time profile, amplitude, and spectral power distribution for excitation of a magnetic resonance of the nuclear spins in the patient 100 by the radio-frequency control system 60 according to one or more of the present embodiments. Pulse powers in the kilowatt range may, for example, be achieved. The individual units are connected to one another via a signal bus 25.

The radio-frequency signal generated by the radio-frequency control system 60 of the radio-frequency unit 22 is supplied to the body coil 14 via a signal connection and emitted into in the body of the patient 100 in order to excite the nuclear spins there. In one embodiment, the radio-frequency signals may be emitted via one or more local coils 50.

The local coil 50 may then receive a magnetic resonance signal from the body of the patient 100, because, due to the short distance, the signal-to-noise ratio (SNR) of the local coil 50 is better than with reception by the body coil 14. The MR signal received by the local coil 50 is conditioned in the local coil 50 and forwarded to the radio-frequency unit 22 of the magnetic resonance tomography system 1 for evaluation and image acquisition. In one embodiment, the signal connection 33 is used for this, but, for example, wireless transmission may also be provided.

Figure 2:
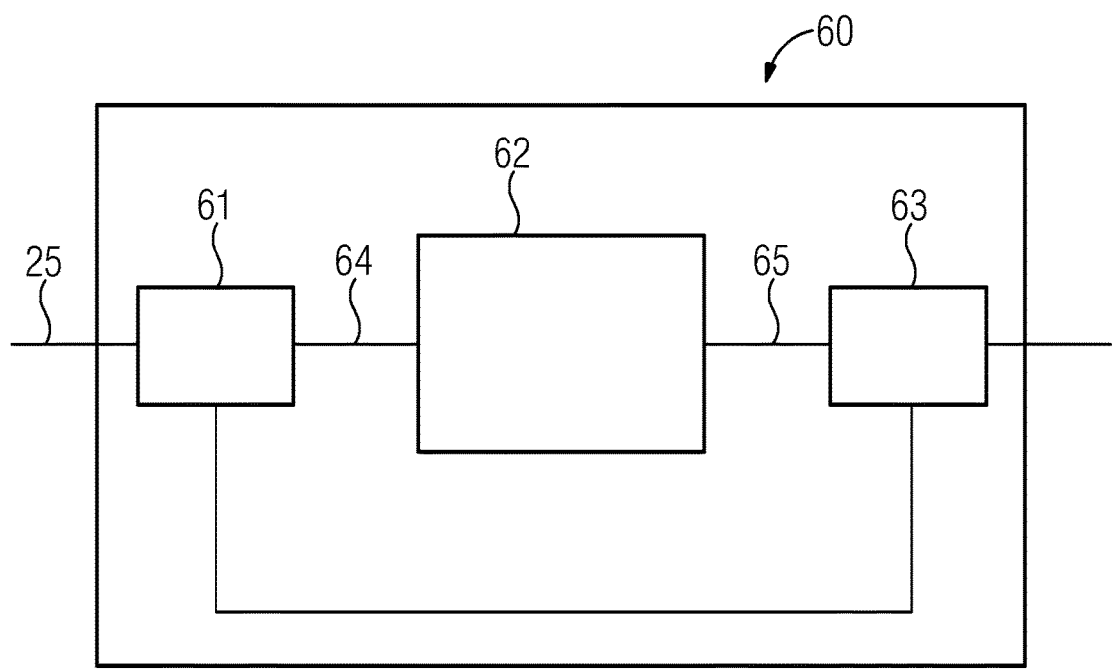
FIG. 2 shows a schematic depiction of a radio-frequency control system according to an embodiment.

The radio-frequency control system 60 according to one or more of the present embodiments is described below in more detail with reference to FIG. 2.

The radio-frequency control system 60 includes a controller 61 that is in signal connection with the signal input 64 of a radio-frequency power amplifier 62. The radio-frequency power amplifier 62 amplifies a control signal applied to the signal input 64 and generates therefrom a radio-frequency output signal with a power of up to several kilowatts at the signal output 65. The radio-frequency output signal is then emitted via the body coil 14 or a local coil 50 as an antenna in order to excite nuclear spins in a patient. To measure the power generated, a power meter 63 that measures the power emitted by the radio-frequency power amplifier 62 to the antenna and forwards the measured power via a signal connection to the controller 61 is provided. The power meter may, for example, include a directional coupler and an AD converter. In one embodiment, an average power may be determined by rectification or the waveform may be sampled in real time. In one embodiment, the power emitted is monitored by the controller 61, and if a limit value (e.g., prescribed in regulatory specifications) is exceeded, emission is interrupted to provide the safety of a patient and adhere to SAR limit values.

The controller 61 may, for example, generate a control pulse for simultaneous excitation of a plurality of slices in the body of the patient 100 along the z-axis 2. Hereinafter, 'control pulse' designates the signal before the radio-frequency power amplifier 62, while 'excitation pulse' designates the control pulse after amplification by the radio-frequency power amplifier 62 at the signal output 65, which, after emission via the antenna, then excites the nuclear spins.

Herein, this relates to excitation pulses for individual slices, which, due to the magnetic field gradient, are frequency-shifted in the z-direction. A control pulse for the generation of an excitation pulse for an individual slice may, for example, be stored in a memory of the controller 61 or be recalculated in each case by parameterized functions. The controller 61 then shifts the individual control pulse in the respective frequency range, possibly scales the amplitude and the duration, and adds together the different individual control pulses to form a control pulse for several slices simultaneously. The control pulse may then be output via a DA converter to the radio-frequency power amplifier 62.

The power meter 63 may, however, be defective and supply a false signal. To provide that the patient 100 is not endangered in such a situation, there may be a requirement for a second safety mechanism to determine and limit the power of the excitation pulse. With known amplification of the radio-frequency power amplifier 62, the power may be determined from the control pulse in that, for example, the squared amplitudes are added up by the controller 61 over the duration of the control pulse and then scaled in accordance with the amplification of the radio-frequency power amplifier 62. In one embodiment, this function is implemented in a separate unit for safety reasons.

Herein, the amplification of the radio-frequency power amplifier 62 is generally approximately constant in the frequency range of an excitation pulse for an individual slice. In the case of a multislice excitation pulse, the bandwidth is a multiple of the bandwidth of an individual slice-excitation pulse. Herein, the amplification of the radio-frequency power amplifier may constructively drop toward the upper or lower frequencies by 1 dB, 3 dB, 6 dB 12 dB or more. Another possible cause of such a drop in the frequency response is closed loops in the radio-frequency power amplifier, which only have a limited maximum tracking rate, in order, for example, to provide the stability of the control loop. This results in a frequency drop toward the edges of the frequency band, since the control loop, for example, is no longer able to track quickly enough.

In the prior art, the power estimated using the control pulse does not take account of this drop. As a result, the power of the excitation pulse appears to exceed the limit value and is limited, while the lower amplification at the patient provides the limit value has not yet been reached. The result is images that have a lower signal-to-noise ratio (SNR) or are darker toward the edges.

The controller 61 of the radio-frequency control system 60 according to one or more of the present embodiments is able to take account of the effect of the frequency response of the radio-frequency power amplifier 62 in the estimation of the power based on the control pulse. First, the frequency response is to be known. This may, for example, be calculated using the design data for the radio-frequency power amplifier 62 and stored in the form of a table or a parameterized function in the controller 61 in a memory. In one embodiment, the controller 61 may determine the frequency response in a calibration step in that the controller 61 outputs test signals with different known frequency components and amplitudes and determines the power output with the power meter 63. If the power meter averages the power, a string of test signals may be used with only one frequency in each case. If the power meter is able to digitize the output signal in real time (e.g., with a sampling rate corresponding to double the highest frequency to be generated), the controller 61 may determine the frequency response of the amplifier by a noise signal with a known frequency distribution and a Fourier transform of the power meter signal. The procedure may, for example, only be performed during commissioning, during servicing, or also whenever a patient is positioned in the recording region. This enables a change to the frequency response to be acquired in each case.

In one embodiment of the radio-frequency control system 60, the controller 61 determines a high-frequency power value for the control pulse generated. Herein, 'determine' may not be a power measurement with the power meter 63 at the signal output 65. Instead, the controller weights the control pulse with a frequency-dependent factor that takes account of the subsequent frequency-dependent amplification in the radio-frequency power amplifier 62 in accordance with the predetermined frequency response. The controller 61 may, for example, perform a Fourier transform of the control pulse in order to image the signal in frequency space and weight the control pulse there with the predetermined frequency response. A filter with filter coefficients may, however, be determined from the frequency response that damps an input signal in accordance with the frequency response. The controller 61 applies this filter to the control signal before, for example, squared amplitudes are then added up for the determination of the high-frequency power value. Herein, a separate calculating unit that is independent of the unit that determines the control pulse may be provided in the controller 61. This enables independence of the generation of the control pulse and monitoring to be provided.

In another embodiment of the radio-frequency control system, however, the controller 61 may first determine a nominal control pulse that would correspond to the desired multislice excitation with a linear frequency response of the radio-frequency power amplifier 62. The controller 61 then generates the control pulse by a filter from the nominal control pulse. Herein, the filter is determined from the frequency response of the radio-frequency power amplifier 62 such that the application of the filter with the subsequent frequency response of the radio-frequency power amplifier results in a substantially linear frequency response of the system consisting of the controller 61 and radio-frequency power amplifier 62 with respect to the nominal control pulse. Herein, the controller may determine from the nominal control pulse a high-frequency power value that, via the frequency response-dependent filter, is dependent on the control pulse. Herein, for the purpose of the present embodiments, a filter may be considered to be any device or also any calculating operation that achieves the desired linearization. For example, transformation of the nominal control pulse by a Fourier transform into frequency space, multiplying with the inverse value of the damping factor, and back-transformation into the time domain may be provided. As another example, a filter in the time domain with coefficients determined from and in dependence on the frequency response of the radio-frequency power amplifier 62 may be provided.

In one embodiment, the radio-frequency control system 60 compares the determined high-frequency power value with a predetermined limit radio-frequency value. This may take place in the controller 61 by a comparator. If the high-frequency power value exceeds the limit radio-frequency value, the controller 61 interrupts the output of the control pulse to the radio-frequency power amplifier 62. This may take place in that the controller not only outputs a constant value corresponding to a value of zero to the DA converter. In one embodiment, the comparator directly controls a switch that interrupts the signal connection between the controller 61 and the signal input 64 of the radio-frequency power amplifier 62. This provides the safety of the patient using an independent circuit.

Figure 3:
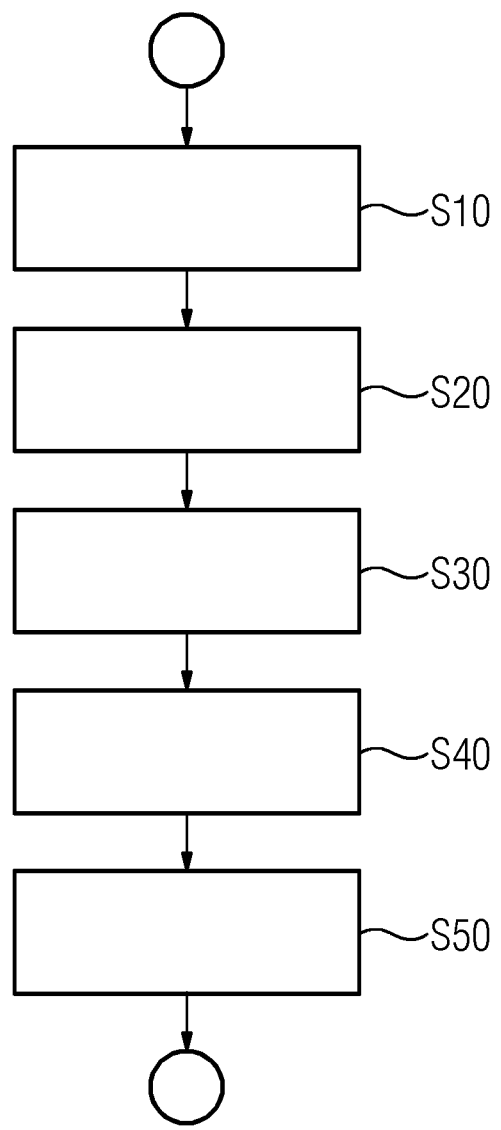
FIG. 3 shows an exemplary schematic flowchart of a method according to an embodiment.

FIG. 3 depicts the acts of a method according to an embodiment in a possible sequence.

In act S10, the controller 61 determines, for example, the frequency response of the radio-frequency amplifier 62 in that the controller 61 outputs a test signal with different frequency components to the signal input 64 of the radio-frequency power amplifier 62 and, via the power meter 63, determines a power output from the radio-frequency power amplifier 62 at the signal output 65 of a radio-frequency signal output as a response to the test signal. This act may, for example, be performed on the installation of a magnetic resonance tomography system, after servicing or on the positioning of a new patient. In one embodiment, the frequency response may be determined during the construction or production of the radio-frequency power amplifier 62 and then stored in the controller 61.

In act S20, the controller 61 determines a control pulse for multislice excitation. For example, a control pulse may be determined using the gradient field strength in the z-direction, desired slice thicknesses, and slice spacing. Depending upon the desired position along the z-axis, a control pulse for an individual slice along the z-axis may be shifted by a frequency that is dependent on the gradient. The amplitude depends upon the desired excitation strength. Several of these frequency-shifted individual slice control pulses may then superimposed by addition to form a multislice control pulse.

In act S30, the controller 61, for example, or also another unit, determines a limit radio-frequency value for the control pulse from the control pulse or a nominal control pulse that is independent of the frequency response from which the control pulse is generated in dependence on the predetermined frequency response of the radio-frequency power amplifier. For example, the controller 61 may transfer the control signal into the frequency domain with a Fourier transform, apply the predetermined frequency response of the radio-frequency power amplifier 62 there to the control signal, and then retransform the control signal into the time domain. In one embodiment, however, a filter equivalent thereto may be determined in the time domain, and the filter may be applied to the control signal. The squared amplitude may be used to determine a high-frequency power value for the control signal. In addition, integration over time may be used to determine a mean value for the power or an amount of energy per time. A high-frequency power value that is linked via the frequency response of the radio-frequency power amplifier to the corresponding high-frequency power value for the control pulse may, however, be determined from the nominal control pulse. According to one or more of the present embodiments, the act S30 does not relate to a direct measurement of the output power of the radio-frequency power amplifier 62 (e.g., by the power meter 63 at the signal output 65).

In act S40, the radio-frequency control system 60 compares the determined high-frequency power value with a predetermined limit radio-frequency value, such as may be prescribed, for example, in regulatory specifications for the SAR. The limit radio-frequency value may, for example, be derived from the SAR limit value by scaling to the radiated volume. The comparison may be performed by the controller 61 or an independent unit.

If the limit radio-frequency value is exceeded, in act S50, the controller 61, or an independent unit, switches off the output of the control pulse to the radio-frequency power amplifier 62.

The sequence of acts described is a possible sequence but may be varied within the scope of the invention without departing from the invention. For example, the act S10 may only be required once or may be repeated at different times. The act S20 may, for example, when designing a sequence, be performed only at the start of sequence or also before each individual control pulse.

Although the invention was illustrated and described in more detail by the exemplary embodiments, the invention is not restricted by the disclosed examples. Other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A radio-frequency control system for a magnetic resonance tomography system, the radio-frequency control system comprising:
    a controller; and
    a radio-frequency power amplifier with amplification between a signal input and a signal output of the radio-frequency power amplifier that is dependent on a predetermined frequency response,
    wherein the controller is configured to:
        determine a control pulse for multislice excitation;
        output the control pulse to the signal input of the radio-frequency power amplifier; and
        weight the control pulse with the predetermined frequency response of the radio-frequency power amplifier to determine a high-frequency power value for the control pulse in dependence on the predetermined frequency response of the radio-frequency power amplifier from the control pulse.

2. The radio-frequency control system of claim 1, wherein the controller is further configured to weight a nominal control pulse for the generation of the control pulse with a function that is inverse to the predetermined frequency response.

3. The radio-frequency control system of claim 1, further comprising a power meter in signal connection with the signal output of the radio-frequency power amplifier,
    wherein the controller is configured to determine the predetermined frequency response on a change of patient.

4. The radio-frequency control system of claim 2, further comprising a power meter in signal connection with the signal output of the radio-frequency power amplifier,
    wherein the controller is configured to determine the predetermined frequency response on a change of patient.

5. The radio-frequency control system of claim 1, wherein the controller is further configured to:
    compare the determined high-frequency power value with a predetermined limit radio-frequency value; and
    interrupt the output of the control pulse for multislice excitation to the signal input of the radio-frequency power amplifier when the limit radio-frequency value is exceeded by the high-frequency power value.

6. The radio-frequency control system of claim 2, wherein the controller is further configured to:
    compare the determined high-frequency power value with a predetermined limit radio-frequency value; and
    interrupt the output of the control pulse for multislice excitation to the signal input of the radio-frequency power amplifier when the limit radio-frequency value is exceeded by the high-frequency power value.

7. The radio-frequency control system of claim 3, wherein the controller is further configured to:
    compare the determined high-frequency power value with a predetermined limit radio-frequency value; and
    interrupt the output of the control pulse for multislice excitation to the signal input of the radio-frequency power amplifier when the limit radio-frequency value is exceeded by the high-frequency power value.

8. A method for operating a magnetic resonance tomography system, wherein the magnetic resonance tomography system comprises a radio-frequency control system, the radio-frequency control system comprising a controller and a radio-frequency power amplifier with amplification between a signal input and a signal output of the radio-frequency power amplifier that is dependent on a predetermined frequency response, the method comprising: determining, by the controller, a control pulse for multislice excitation; outputting the control pulse to the signal input of the radio-frequency power amplifier; determining a high-frequency power value for the control pulse in dependence on the predetermined frequency response of the radio-frequency power amplifier from the control pulse or a nominal control pulse that is independent of the predetermined frequency response, from which the control pulse is generated; and generating the control pulse, generating the control pulse comprising weighting, by the radio-frequency control system, the nominal control pulse with a function that is inverse to the frequency response.

9. The method of claim 8, wherein determining the high-frequency power value comprises weighting, by the radio-frequency control system, the control pulse with the frequency response of the radio-frequency power amplifier.

10. The method of claim 8, wherein the radio-frequency control system comprises a power meter in signal connection with the signal output of the radio-frequency power amplifier, and
    wherein the method further comprises determining, by the power meter, the predetermined frequency response on a change of patient.

11. The method of claim 8, further comprising:
comparing, by the radio-frequency control system, the determined high-frequency power value with a predetermined limit radio-frequency value; and
interrupting the outputting of the control pulse for multislice excitation to the signal input of the radio-frequency power amplifier when the limit radio-frequency value is exceeded by the high-frequency power value.

12. In a non-transitory computer-readable storage medium that stores instructions executable by a controller of a radio-frequency control system to operate a magnetic resonance tomography system, the magnetic resonance tomography system comprising the radio-frequency control system, the radio-frequency control system comprising a radio-frequency power amplifier with amplification between a signal input and a signal output of the radio-frequency power amplifier that is dependent on a predetermined frequency response, the instructions comprising: determining, by the controller, a control pulse for multislice excitation; outputting the control pulse to the signal input of the radio-frequency power amplifier; determining a high-frequency power value for the control pulse in dependence on the predetermined frequency response of the radio-frequency power amplifier from the control pulse or a nominal control pulse that is independent of the frequency response, from which the control pulse is generated; and generating the control pulse, generating the control pulse comprising weighting, by the radio-frequency control system, the nominal control pulse with a function that is inverse to the frequency response.

13. The non-transitory computer-readable storage medium of claim 12, wherein determining the high-frequency power value comprises weighting, by the radio-frequency control system, the control pulse with the frequency response of the radio-frequency power amplifier.

14. The non-transitory computer-readable storage medium of claim 12, wherein the radio-frequency control system comprises a power meter in signal connection with the signal output of the radio-frequency power amplifier, and
wherein the instructions further comprise determining, by the power meter, the predetermined frequency response on a change of patient.

15. The non-transitory computer-readable storage medium of claim 12, wherein the instructions further comprise:
comparing, by the radio-frequency control system, the determined high-frequency power value with a predetermined limit radio-frequency value; and
interrupting the outputting of the control pulse for multislice excitation to the signal input of the radio-frequency power amplifier when the limit radio-frequency value is exceeded by the high-frequency power value.

16. A radio-frequency control system for a magnetic resonance tomography system, the radio-frequency control system comprising:
a controller;
a radio-frequency power amplifier with amplification between a signal input and a signal output of the radio-frequency power amplifier that is dependent on a predetermined frequency response; and
a power meter in signal connection with the signal output of the radio-frequency power amplifier,
wherein the controller is configured to:
determine a control pulse for multislice excitation;
output the control pulse to the signal input of the radio-frequency power amplifier;
determine the predetermined frequency response on a change of patient; and
determine a high-frequency power value for the control pulse in dependence on the predetermined frequency response of the radio-frequency power amplifier from the control pulse or a nominal control pulse that is independent of the frequency response from which the control pulse is generated.

17. The radio-frequency control system of claim 16, wherein the controller is further configured to:
compare the determined high-frequency power value with a predetermined limit radio-frequency value; and
interrupt the output of the control pulse for multislice excitation to the signal input of the radio-frequency power amplifier when the limit radio-frequency value is exceeded by the high-frequency power value.

* * * * *